United States Patent
Sample et al.

(10) Patent No.: US 9,378,446 B2
(45) Date of Patent: Jun. 28, 2016

(54) SOLAR POWERED RFID TAGS AND METHOD OF MANUFACTURE THEREFORE

(75) Inventors: Alanson P. Sample, Seattle, WA (US); Yuri A. Sylvester, Tempe, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 523 days.

(21) Appl. No.: 13/047,341

(22) Filed: Mar. 14, 2011

(65) Prior Publication Data

US 2012/0234922 A1    Sep. 20, 2012

(51) Int. Cl.
G06K 19/06 (2006.01)
G06K 19/07 (2006.01)
G06K 19/077 (2006.01)
H01L 31/046 (2014.01)

(52) U.S. Cl.
CPC ...... G06K 19/0704 (2013.01); G06K 19/07773 (2013.01); H01L 31/046 (2014.12); Y02E 10/50 (2013.01)

(58) Field of Classification Search
USPC .......................................................... 235/492
See application file for complete search history.

(56) References Cited

U.S. PATENT DOCUMENTS

| 6,078,111 | A | * | 6/2000 | Sun | H03K 17/72 250/200 |
| 2008/0174436 | A1 | * | 7/2008 | Landt | G06K 19/07749 340/572.7 |
| 2012/0206243 | A1 | * | 8/2012 | Butler | G06K 7/0008 340/10.51 |
| 2013/0009851 | A1 | * | 1/2013 | Danesh | H01G 9/20 343/904 |

\* cited by examiner

*Primary Examiner* — Michael G Lee
*Assistant Examiner* — David Tardif
(74) *Attorney, Agent, or Firm* — Ellis B. Ramirez; Prass LLP

(57) ABSTRACT

An embodiment of the present invention provides an apparatus, comprising a radio frequency identification (RFID) tag, wherein the RFID tag includes an antenna, and wherein at least one amorphous silicon or organic photovoltaic solar cell is integrated with the antenna.

21 Claims, 3 Drawing Sheets

SOLAR POWERED RFID TAGS AND METHOD OF MANUFACTURE THEREFORE

BACKGROUND

Radio-frequency identification (RFID) is a technology that uses communication via radio waves to exchange data between a reader and an electronic tag attached to an object, for the purpose of identification and tracking. Some tags can be read from several meters away and beyond the line of sight of the reader.

Radio-frequency identification involves interrogators (also known as readers), and tags (also known as labels). Most RFID tags contain at least two parts. One is an integrated circuit for storing and processing information, modulating and demodulating a radio-frequency (RF) signal, and other specialized functions. The other is an antenna for receiving and transmitting the signal.

There are three types of RFID tags: passive RFID tags, which have typically have no power source and require an external electromagnetic field to initiate a signal transmission, active RFID tags, which contain a battery and can transmit signals once an external source ('Interrogator') has been successfully identified, and battery assisted passive (BAP) RFID tags, which require an external source to wake up but have significant higher forward link capability providing greater range.

RFID has many applications; for example, it is used in enterprise supply chain management to improve the efficiency of inventory tracking and management. The most significant barrier to improving passive RFID tag performance for both fixed function ID tags and RFID tags enhanced with sensors and computing ability is the limitation on the amount of RF power that can be harvested for operation.

Thus, a critical need is prevalent for improved RFID tags.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
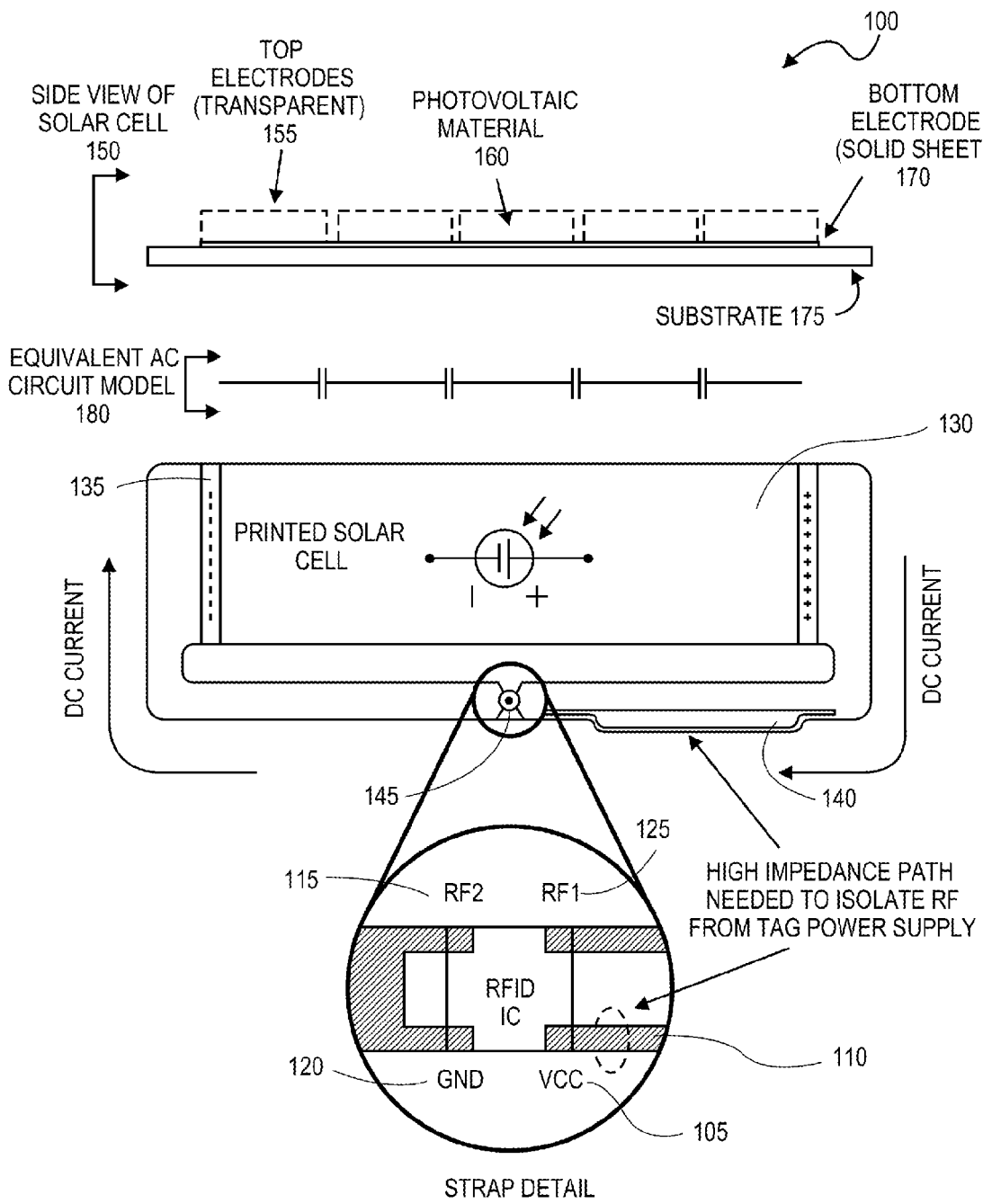
FIG. 1 illustrates a conceptual diagram of a solar enhanced RFID tag antenna with an RFID IC according to embodiments of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the preset invention may be practiced without these specific details. In other instances, well-known methods, procedures, components and circuits have not been described in detail so as not to obscure the present invention.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. For example, "a plurality of stations" may include two or more stations.

Embodiments of the present invention incorporate solar power harvesting capability into existing passive (battery free) RFID tags without adding additional parts or changing the tag assembly process. The present invention may employ the tag's antenna as a dual function element in which the antenna simultaneously harvests RF energy, communicates with the RFID reader, and harvests solar energy for auxiliary power. This is accomplished by using low cost, printable photovoltaics deposited on flexible substrate to form part of the antenna's radiating structure. Embodiments of the present invention may re-use the antenna surface area as a substrate to print photovoltaics on and use the antenna as buss bars for the solar cell. The present invention provides for a method for injecting harvested solar power (DC) into the IC in a manner that does not inject RF noise into the IC's power supply and may use materials and manufacturing methods that are compatible with RFID manufacturing procedures, are low cost, and can be done in high volume.

In order for a solar-enhanced RFID antenna to be successfully integrated into either fixed function ID or enhanced RFID tags, it is necessary that the replacement of the standard antenna with solar cells does not alter the manufacturability or usability of the device. Recent breakthroughs in printed electronics have allowed for low cost, printed solar cells that can be manufactured in high volume and in a roll-to-roll process or wide-web, ink-jet printing, gravure printing, and screen printing, just to name a few. Generally speaking, the manufacturing processes for amorphous silicon and organic photovoltaic (rather than crystalline silicon) solar cells are compatible with present day RFID antenna printing techniques, although there can be variations between manufacturers due to the type of application and the material properties. In both cases, metal traces for DC electrodes and antenna elements can be screen printed, applied with a material printer, or chemically deposited and etched. Solar material is typically applied as a thin film with a squeegee type application, screen printing process, or deposited with a material printer. Embodiments of the present invention may provide techniques for manufacturing flexible electronics, such as, but not limited to: wide-web roll-to-roll, ink-jet printing, gravure printing, and screen printing.

Amorphous silicon (a-Si or α-Si) is the non-crystalline allotropic form of silicon. It can be deposited in thin films at low temperatures onto a variety of substrates, offering some unique capabilities for a variety of electronics.

Silicon is a fourfold coordinated atom that is normally tetrahedrally bonded to four neighboring silicon atoms. In crystalline silicon this tetrahedral structure continues over a large range, thus forming a well-ordered crystal lattice. In amorphous silicon this long range order is not present. Rather, the atoms form a continuous random network. Moreover, not all the atoms within amorphous silicon are fourfold coordinated. Due to the disordered nature of the material some atoms have a dangling bond. Physically, these dangling bonds represent defects in the continuous random network and may cause anomalous electrical behavior.

If desired, the material can be passivated by hydrogen, which bonds to the dangling bonds and can reduce the dangling bond density by several orders of magnitude. Hydrogenated amorphous silicon has a sufficiently low amount of defects to be used within devices. However, the hydrogen is unfortunately associated with light induced degradation of the material, termed the Staebler-Wronski Effect.

Amorphous alloys of silicon and carbon (amorphous silicon carbide, also hydrogenated, a-Si1-xCx:H) are an interesting variant. Introduction of carbon atoms adds extra degrees of freedom for control of the properties of the material. The film could also be made transparent to visible light.

Increasing concentrations of carbon in the alloy widen the electronic gap between conduction and valence bands (also called "optical gap" and bandgap). This can potentially increase the light efficiency of solar cells made with amorphous silicon carbide layers. On the other hand, the electronic properties as a semiconductor (mainly electron mobility), are adversely affected by the increasing content of carbon in the alloy, due to the increased disorder in the atomic network.

While a-Si suffers from lower electronic performance compared to c-Si, it is much more flexible in its applications. For example, a-Si layers can be made thinner than c-Si, which may produce savings on silicon material cost.

One further advantage is that a-Si can be deposited at very low temperatures, e.g., as low as 75 degrees Celsius. This allows for deposition on not only glass, but plastic as well, making it a candidate for a roll-to-roll processing technique. Once deposited, a-Si can be doped in a fashion similar to c-Si, to form p-type or n-type layers and ultimately to form electronic devices.

Another advantage is that a-Si can be deposited over large areas by plasma enhanced chemical vapor deposition (PECVD). The design of the PECVD system has great impact on the production cost of such panel, therefore most equipment suppliers put their focus on the design of PECVD for higher throughout, that leads to lower manufacturing cost.

Improvements in a-Si construction techniques have made them more attractive for large-area solar cell. Here their lower inherent efficiency is made up, at least partially, by their thinness—higher efficiencies can be reached by stacking several thin-film cells on top of each other, each one tuned to work well at a specific frequency of light. This approach is not applicable to c-Si cells, which are thick as a result of their construction technique and are therefore largely opaque, blocking light from reaching other layers in a stack.

The main advantage of a-Si in large scale production is not efficiency, but cost. a-Si cells use approximately 1% of the silicon needed for typical c-Si cells, and the cost of the silicon is by far the largest factor in cell cost. However, the higher costs of manufacture due to the multi-layer construction have, to date, make a-Si unattractive except in roles where their thinness or flexibility are an advantage.

Microcrystalline silicon (also called nanocrystalline silicon) is amorphous silicon, but also contains small crystals. It absorbs a broader spectrum of light and is flexible. Micromorphous silicon module technology combines two different types of silicon, amorphous and microcrystalline silicon, in a top and a bottom photovoltaic cell. Sharp produces cells using this system in order to more efficiently capture blue light, increasing the efficiency of the cells during the time where there is no direct sunlight falling on them. Protocrystalline silicon is often used to optimize the open circuit voltage of a-Si photovoltaics.

It is understood that terms microcrystalline, nanocrystalline, and micromorphous as understood by those or ordinary skill in the art can be used interchangeably. Also, it is noted that protocrystalline silicon can be used at an interface to improve the Voc of the solar cell.

One of the limiting factors for adapting RFID technology is the limitation on read range. This invention would allow manufactures to dramatically increase range. Embodiments of the present invention would increase update rate and reliability. Under powered and marginally powered tags are difficult to read and can allow critical inventory to be misread. Embodiments of the present invention would provide more power (given standard indoor lighting conditions) for the tags circuitry allowing for more reliable and frequent reads.

Active RFID tags use external batteries, or other power sources, that are difficult to incorporate into the tag design and add additional cost, size, and weight to the final product. Embodiments of the present invention use low cost flexible solar cells that are printed on to the antenna for easy manufacturing. This method increases the range, update rate, and provides additional power for sensors and peripherals for passive RFID tags in a way that is highly manufacturable—which is not the case for current methods.

Embodiments of the present invention enable an RFID tag to operate away from the reader. Presently RFID tag operation is limited to the interrogation field of the RFID reader (less than 10 m). The present invention will allow RFID tags to operate anywhere there are low ambient light levels (for example office lighting). This will enable a new class of RFID tags enhanced with sensing and computing capabilities to operate independently of the RFID reader.

Embodiments of the present invention may save power by decreasing the amount of power transmitted by the RFID reader. Since the tag can harvest power for its own operation, the RFID reader can lower its transmitted power levels, thus saving energy.

As stated above, the present invention provides a novel, dual purpose RFID tag antenna that simultaneously harvests RF energy, communicates with the RFID reader, and harvests solar energy for auxiliary power. The present invention leverages modern printed, photovoltaic manufacturing techniques, which produce thin, low-cost, flexible solar cells and integrate them into printed RFID antennas. Embodiments of the present invention may double the effective range of the RFID tag, as well as allows for operation independent of the RFID reader under typical office lighting conditions.

In order for a solar enhanced RFID antenna to be successfully integrated into either fixed function ID or enhanced RFID tags, it is necessary that the addition of the solar cells does not alter the manufacturability or usability of the device. Recent breakthroughs in printed electronics have allowed for low cost, printed solar cells that can be manufactured in high volume and in a roll-to-roll process. Generally speaking, the manufacturing processes for solar cells are compatible with present day RFID antenna printing techniques; although there can be variations between manufacturers due to the type of application and the material properties. In both cases, metal traces for DC electrodes and antenna elements can be screen printed, applied with a material printer, or chemically deposited and etched. Solar material is typically applied as a thin film with a squeegee type application, screen printing process, or deposited with a material printer. For RFID tags, the power that can be harvested by photovoltaics covering the RFID label's surface area is sufficient to completely power the tag. As an example, a flexible, thin-film solar cells may produce 2-4 mW/cm2 under full sunlight. This means that even under low lighting conditions, where only a fraction of this power is available, there will be ample power for RFID ICs.

Looking now at FIG. 1, shown generally as 100, is a conceptual diagram of a solar enhanced RFID tag. VCC 105 is connected to the positive bus of the solar cell via a high-impedance trace 110. RF2 115 and Ground 120 are connected to the same port of the antenna. RF1 125 is connected to the opposite port of the antenna as RF2 115 and Ground 120. The antenna can be printed on to standard, flexible substrates, with the antenna electrodes themselves printed in copper or silver. The key attribute of this design is that the solar cell 130 is part of the radiating structure of the antenna 135. This has the advantage of decreasing the overall surface area of the final label as well as reducing material and fabrication costs. Optimization of the solar cell area for the required power output and number of cells for output voltage may be necessary for different loads and application.

In order to use the DC power generated by the solar cell 130, it is necessary that the bus bars, metal grids, or transparent conductors 140 on the cell are orientated in such a way that they can easily be integrated into the antenna and supply power to the IC, without the need for additional traces. Photovoltaics and the electrodes are typically on opposite sides of the solar cells to maximize the generated voltage potential. The folded dipole 145 suggests a simple solution to the DC trace issue and the folded section (adjacent to the IC) coated with a solar material and the dipole section (connected to the IC) which acts as both DC supply rails for the cell and as part of the RF antenna.

Since the RFID tag needs to accept DC power as well as RF signals, the IC in embodiments of the present invention may be modified to expose the un-regulated power supply node which is typically the rectifier output. Considering that many commercial RFID tags are four pin devices embodiments of the present invention provide reallocating one of the redundant ground pins for DC input as shown at 120. A design challenge was to insure proper isolation between the DC power input and the RF signal so that RF noise does not compromise the performance of the IC. Embodiments of the present invention ma use a thin metal trace that presents a high impedance path to the RF signal while allowing DC power to pass through to the IC.

An exaggerated side view of a typical amorphous silicon solar cell unit a solar cell of embodiments of the present invention is shown at 150, with top electrodes, photovoltaic material and bottom electrodes depicted at 155, 160 and 170 respectively. The substrate is shown at 175. Since the individual cells are connected in series to produce the desired output voltage, the positive and negative electrodes of each cell are interleaved creating a highly capacitive interface. One might assume that the PN junction of the solar cell would rectify the RF signal. However, at UHF frequencies, the RF energy takes the low impedance "capacitive" path from electrode to electrode. The result is the AC equivalent model shown at 180 that illustrates the RF property of the circuit.

Since the capacitance of the junctions is effectively very large, the cell performs very similarly to a uniform metal sheet at UHF frequencies. The top electrode may or may not be transparent. If a-Si is used, then electrodes may be opaque or transparent, and patterned in such a way that it does not interfere with an RF signal. If organic photovoltaic (OPV), given today's roadmap of efficiency (dictated by limitations in physics of OPV materials), top electrodes must be transparent. The following terms may be included in embodiments of the present invention: "printed electronics", "solution processable OPV", "P3HT:PCBM". P3HT:PCBM is and will be the most widely used OPV system in printed photovoltaics and may be implemented in embodiments of the present invention.

The bottom electrode may or may not be a "continuous" solid sheet, but may be "patterned" to optimize RF response. Embodiments of the present invention provide for the design and performance of two distinct solar-enhanced antennas. A first embodiment is designed specifically for an RFID IC, and illustrates the viability of constructing a low cost, size reduced antenna with integrated solar cells. A second embodiment of the present invention provided herein illustrates the benefit of increased available power provided by a photovoltaic-enhanced tag antenna on system performance on a fully passive (battery free) printed circuit board (PCB) RFID tag, and has the unregulated power supply pin exposed so that the tag's power source may be augmented.

Figure 2:
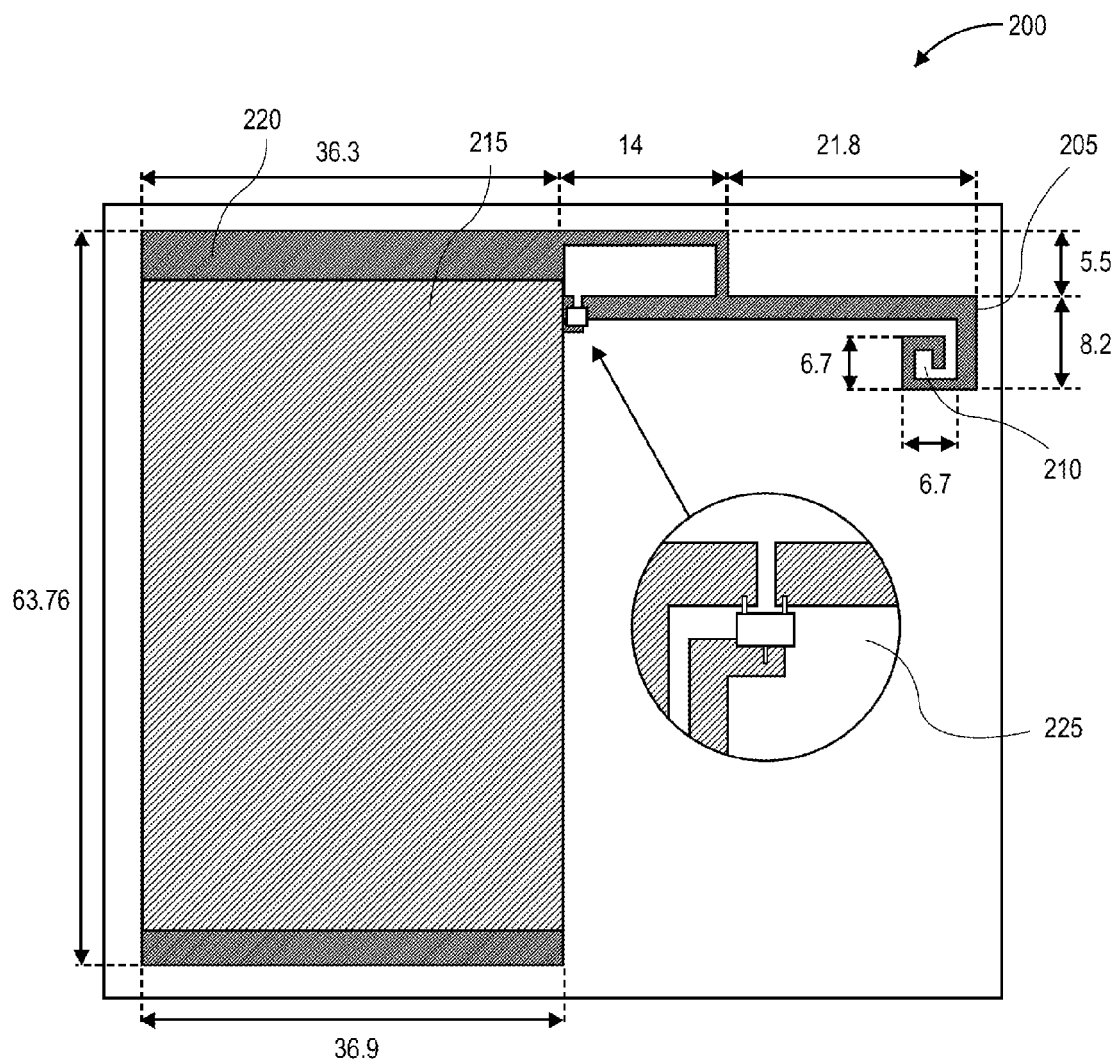
FIG. 2 illustrates a diagram of the photovoltaic-enhanced antenna for an RFID IC according to embodiments of the present invention.

Looking now at FIG. 2, generally as 200, is an illustration of a proposed IC-specific solar antenna design. The operation of the antenna can be viewed as a monopole mirrored 215 over the solar cell 220, which is acting as a ground plane. An inductive strap is added to provide the necessary reactance to conjugate match to the capacitive RFID IC. The vertical section of the antenna arm (shown with length 8.2 mm) 205 can be varied to tune the resonant frequency of the antenna. The small spiral 210 on the end of the antenna enables additional fine tuning of reactance.

In order to draw power from the solar cell, the DC bus bars, metal grids, or transparent conductors located at the either ends of the cell need to be connected to the IC. To accomplish this, the antenna's arm is relocated to the top of the cell and connected to the negative terminal of the solar cell. This allowed the inductive strap and the GND pin of the tag to be at the same DC voltage potential. The positive terminal of the solar cell is located at the bottom and a thin trace is added to connect it to the IC. This can be seen in the detail pop out 225 in FIG. 2, where an RFID IC with an extra terminal is shown connected to the antenna.

Figure 3:
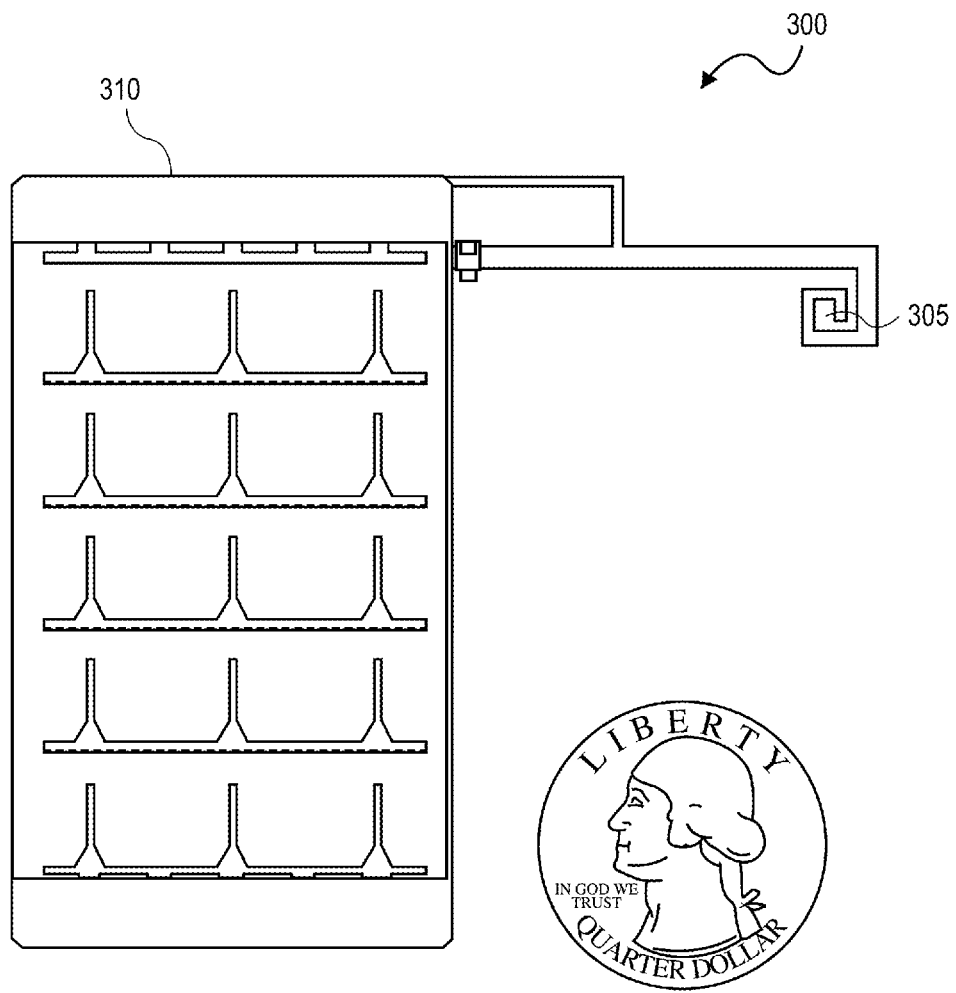
FIG. 3 depicts an image of the photovoltaic-enhanced RFID antenna connected to an a packaged RFID IC according to embodiments of the present invention.

FIG. 3 at 300, shows an image of the constructed photovoltaic-enhanced RFID antenna. The metal traces 310 were cut with an automatic stencil cutter and mounted to a 1 mm thick Plexiglas backing 305 for rigidity and testing purposes. The solar cell used in this prototype is the Powerfilm SP3-37 amorphous silicon solar cell, although the present invention is not limited in this respect. This particular solar cell is chosen because of its relatively small size, flexibility, and because it is produced through a low-cost roll-to-roll printing process. This low-cost manufacturing means that, in the future, the overall cost of large-scale production for the solar-enhanced antenna will be inexpensive and compatible with current RFID tag manufacturing processes. An initial prototype antenna may be built on Plexiglas substrate for test purposes; however embodiments of the present invention may more likely be printed, along with the solar cell, onto a flexible substrate similar to current RFID tags. The SP3-37 solar cell has an peak output of 3.0 v at 22 mA under full sunlight (107,527 Lux) and an output of 2.5 v at 100 uA under typical office lighting (330 Lux). The Powerfilm solar cell is modified in embodiments of the present invention to expose the bus bars, metal grids, or transparent conductors from the underside. It may then be gently soldered to the copper traces of the antenna. Lastly, packaged RFID IC may be soldered to the antenna to complete the RFID tag. Amorphous Si PV cells are more useful for outdoor application (most conversion power comes from UV range), while OPV are more useful for indoor applications (most conversion power comes from visible light range). An OPV would theoretically work better than a-Si under low light conditions (e.g., office lighting).

Simulation results show that the antenna has a maximum gain of 1.7 dBi and a radiation pattern typical of a dipole antenna. Considering the complexity of the solar panel's construction and material characteristics, simulations were run using a simple all-copper model with identical dimensions. Because the simulation was simplified in this manner, it is important to show that the addition of the photovoltaic material does not significantly alter the RF performance of the antenna.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

We claim:

1. An apparatus, comprising:
    a radio frequency identification (RFID) tag, wherein said RFID tag includes an antenna;
    wherein at least one amorphous silicon or organic photovoltaic solar cell is integrated with said antenna; and
    an integrated circuit (IC) with a ground pin reallocated as a power supply node and with at least one pin to receive RF signals from the antenna, wherein the ground pin reallocated as a power supply node is exposed;
    wherein the ground pin reallocated as a power supply node is an un-regulated power supply node;
    wherein said at least one amorphous silicon or organic photovoltaic solar cell is part of a radiating structure of said antenna;
    wherein the power supply node at said IC is exposed and wherein to insure proper isolation between a DC power input and an RF signal so that RF noise does not compromise performance of said IC, a thin metal trace that presents a high impedance path to said RF signal while allowing DC power to pass through to the IC is used.

2. The apparatus of claim 1, wherein photovoltaics cover said RFID label's surface area.

3. The apparatus of claim 1, wherein an area of said at least one amorphous silicon or organic photovoltaic solar cell is optimized for a required power output and said at least one amorphous silicon or organic photovoltaic solar cell is a number of cells required for output voltage necessary for different loads and application and is sufficient to completely power said tag.

4. The apparatus of claim 3, further comprising bus bars, metal grids, or transparent conductors on said at least one amorphous silicon or organic photovoltaic solar cell and orientated in such for easy integration into said antenna and to supply power to said IC, without need for additional traces.

5. The apparatus of claim 4, wherein said at least one amorphous silicon or organic photovoltaic solar cell comprises a section adjacent to said IC coated with a solar material, and an antenna lead section connected to said IC which acts as both DC supply rails for said at least one solar cell and as part of said antenna.

6. A method of powering an RFID tag, comprising:
    integrating at least one amorphous silicon or organic photovoltaic solar cell into an antenna included in said RFID tag, wherein an area of said at least one amorphous silicon or organic photovoltaic solar cell is optimized for a required power output and said at least one solar cell is a number of cells required for output voltage necessary for different loads and application and is sufficient to completely power said tag; and
    using in said RFID tag an integrated circuit (IC) with a ground pin reallocated as an un-regulated power supply node and with at least one pin to receive RF signals from the antenna;
    wherein the un-regulated power supply node at said IC is exposed and wherein to insure proper isolation between a DC power input and an RF signal so that RF noise does not compromise performance of said IC, a thin metal trace that presents a high impedance path to said RF signal while allowing DC power to pass through to the IC is used.

7. The method of claim 6, further comprising integrating said at least one amorphous silicon or organic photovoltaic solar cell into part of a radiating structure of said antenna.

8. The method of claim 7, wherein photovoltaics cover said RFID label's surface area.

9. The method of claim 8, further comprising integrating bus bars, metal grids, or transparent conductors on said at least one amorphous silicon or organic photovoltaic solar cell and orientating said bus bars in such for easy integration into said antenna and to supply power to the IC, without need for additional traces.

10. The method of claim 9, wherein said at least one amorphous silicon or organic photovoltaic solar cell comprises a section adjacent to said IC coated with a solar material, and an antenna lead section connected to said IC which acts as both DC supply rails for said least one amorphous silicon or organic photovoltaic solar cell and as part of said antenna.

11. A method of manufacturing a solar powered RFID tag, comprising:
    depositing printable amorphous silicon or organic photovoltaics on a flexible substrate to form a solar cell as part of an antenna integrated with said RFID tag;
    using said antenna as bus bars, metal grids, or transparent conductors for said solar cell;
    connecting a voltage source to a positive bus of said solar cell via a high-impedance trace;
    using an integrated circuit (IC) with a ground pin reallocated as a power supply node and with at least one pin to receive RF signals from the antenna, wherein the ground pin reallocated as a power supply node is exposed;
    wherein the ground pin reallocated as a power supply node is an un-regulated power supply node; and
    exposing said power supply node at said IC and using a thin metal trace that presents a high impedance path to said RF signal while allowing DC power to pass through to the IC.

12. The method of manufacturing a solar powered RFID tag of claim 11, further comprising integrating said solar cell as part of a radiating structure of said antenna.

13. The method of manufacturing a solar powered RFID tag of claim 12, further comprising cover said RFID tag's label surface area with photovoltaics.

14. The method of manufacturing a solar powered RFID tag of claim 13, further comprising orienting said bus bars, metal grids, or transparent conductors on said solar cell in such for easy integration into said antenna and to supply power to the IC, without need for additional traces.

15. The method of manufacturing a solar powered RFID tag of claim 14, further comprising forming said solar cell by folding a section adjacent to said IC coated with a solar material, and connecting a dipole section to said IC which acts as both DC supply rails for said at least one solar cell and as part of said antenna.

16. The method of manufacturing a solar powered RFID tag of claim 15, wherein metal traces for DC electrodes and antenna elements are screen printed, applied with a material printer, or chemically deposited and etched.

17. An RFID tag, comprising:
   a multi-function antenna element wherein said antenna is adapted to simultaneously harvests radio frequency (RF) energy, communicate with an RFID reader, and harvests solar energy for auxiliary power; and
   an integrated circuit (IC) with a ground pin reallocated as a power supply node and with at least one pin to receive RF signals from the antenna, wherein the ground pin reallocated as a power supply node is exposed;
   wherein the ground pin reallocated as a power supply node is an un-regulated power supply node;
   wherein the power supply node at said IC is exposed and wherein to insure proper isolation between a DC power input and an RF signal so that RF noise does not compromise performance of said IC, a thin metal trace that presents a high impedance path to said RF signal while allowing DC power to pass through to the IC is used;
   wherein said antenna uses printable amorphous silicon or organic photovoltaics deposited on flexible substrate to form part of said antenna's radiating structure to create at least one solar cell;
   wherein an area of said at least one solar cell is optimized for a required power output and said at least one solar cell is a number of cells required for output voltage necessary for different loads and application and is sufficient to completely power said tag.

18. The RFID tag of claim 17, wherein photovoltaics cover said RFID label's surface area.

19. The RFID tag of claim 18, further comprising bus bars, metal grids, or transparent conductors on said at least one solar cell and orientated in such for easy integration into said antenna and to supply power to an integrated circuit (IC), without need for additional traces.

20. An apparatus, comprising:
   a radio frequency identification (RFID) tag, wherein said RFID tag includes an antenna;
   an integrated circuit (IC) with a ground pin reallocated as a power supply node and with at least one pin to receive RF signals from the antenna, wherein the ground pin reallocated as a power supply node is exposed;
   wherein the ground pin reallocated as a power supply node is an un-regulated power supply node;
   wherein at least one amorphous silicon or organic photovoltaic solar cell is integrated with said antenna and to supply power to an integrated circuit (IC), without need for additional traces;
   bus bars, metal grids, or transparent conductors on said at least one amorphous silicon or organic photovoltaic solar cell and orientated in such for easy integration into said antenna and to supply power to said IC;
   wherein said at least one amorphous silicon or organic photovoltaic solar cell comprises a section adjacent to the IC coated with a solar material, and an antenna lead section connected to the IC which acts as both DC supply rails for said at least one solar cell and as part of said antenna;
   wherein said power supply node at said IC is exposed and wherein to insure proper isolation between a DC power input and an RF signal so that RF noise does not compromise performance of said IC, a thin metal trace that presents a high impedance path to said RF signal while allowing DC power to pass through to the IC is used.

21. The apparatus of claim 20, wherein an area of said at least one amorphous silicon or organic photovoltaic solar cell is optimized for a required power output and said at least one amorphous silicon or organic photovoltaic solar cell is a number of cells required for output voltage necessary for different loads and application and is sufficient to completely power said tag.

* * * * *